(12) United States Patent
Ueno et al.

(10) Patent No.: US 7,921,663 B2
(45) Date of Patent: Apr. 12, 2011

(54) HEAT PIPE HEAT SINK

(75) Inventors: Seizo Ueno, Tokyo (JP); Yoshiya Eda, Tokyo (JP); Shinya Nagamatsu, Tokyo (JP)

(73) Assignee: Furukawa-Sky Aluminum Corp., Tokyo (JP)

( * ) Notice: Subject to any disclaimer, the term of this patent is extended or adjusted under 35 U.S.C. 154(b) by 68 days.

(21) Appl. No.: 11/654,690

(22) Filed: Jan. 18, 2007

(65) Prior Publication Data

US 2007/0187069 A1  Aug. 16, 2007

Related U.S. Application Data

(63) Continuation of application No. PCT/JP2005/013527, filed on Jul. 15, 2005.

(30) Foreign Application Priority Data

Jul. 20, 2004  (JP) ................................. 2004-212127

(51) Int. Cl.
F25D 23/12 (2006.01)
F28D 15/00 (2006.01)
(52) U.S. Cl. .................. 62/259.2; 165/104.33
(58) Field of Classification Search ............. 165/104.21, 165/104.33, 80.3; 361/700; 62/259.2
See application file for complete search history.

(56) References Cited

U.S. PATENT DOCUMENTS

| 4,550,774 A * | 11/1985 | Andres et al. ............. 165/104.21 |
| 4,766,885 A * | 8/1988 | Muramatsu ................... 126/636 |
| 5,000,252 A | 3/1991 | Faghri |
| 5,024,264 A * | 6/1991 | Natori et al. ................... 165/185 |
| 5,199,165 A * | 4/1993 | Crawford et al. ............... 29/846 |
| 5,268,812 A | 12/1993 | Conte |
| 5,355,942 A * | 10/1994 | Conte ...................... 165/104.33 |
| 5,441,102 A * | 8/1995 | Burward-Hoy .......... 165/104.25 |
| 5,725,049 A * | 3/1998 | Swanson et al. ......... 165/104.26 |
| 5,937,936 A | 8/1999 | Furukawa et al. |
| 6,104,611 A * | 8/2000 | Glover et al. .................. 361/700 |
| 6,164,368 A * | 12/2000 | Furukawa et al. ........ 165/104.33 |
| 6,397,941 B1 | 6/2002 | McCullough |
| 6,695,040 B1 * | 2/2004 | Kung et al. .............. 165/104.26 |
| 6,913,072 B2 | 7/2005 | Luo ........................... 165/104.21 |
| 7,002,800 B2 * | 2/2006 | Elias et al. ..................... 361/700 |
| 2002/0088609 A1 | 7/2002 | Tantoush |
| 2002/0124997 A1 * | 9/2002 | Blome ..................... 165/104.21 |
| 2003/0127215 A1 | 7/2003 | Parish, IV et al. |
| 2004/0069460 A1 | 4/2004 | Sasaki et al. |

(Continued)

FOREIGN PATENT DOCUMENTS

EP  1296373 A2  3/2003

(Continued)

OTHER PUBLICATIONS

English translated Abstract Heat Sink, JP2003188321A, Date of publication of application: Jul. 4, 2003.*

(Continued)

*Primary Examiner* — Melvin Jones
(74) *Attorney, Agent, or Firm* — Westerman, Hattori, Daniels & Adrian, LLP

(57) ABSTRACT

A heat sink (1), has heat pipes (3) which are disposed in a high temperature section (A) of a base plate (2) on which a heating element (4) is disposed so that the heat pipes (3) extend from the high temperature section (A) to low temperature sections (B) in different directions.

7 Claims, 4 Drawing Sheets

U.S. PATENT DOCUMENTS

2005/0126766 A1* 6/2005 Lee et al. .................. 165/133

FOREIGN PATENT DOCUMENTS

| | | | |
|---|---|---|---|
| JP | 1-174993 | U | 12/1989 |
| JP | 3-38838 | Y2 | 8/1991 |
| JP | 04-101449 | A | 4/1992 |
| JP | 7-190655 | A | 7/1995 |
| JP | 9-303981 | A | 11/1997 |
| JP | 10-122774 | A | 5/1998 |
| JP | 11-150166 | A | 6/1999 |
| JP | 2000018852 | A | 1/2000 |
| JP | 2000-269676 | A | 9/2000 |
| JP | 2002-262583 | A | 9/2002 |
| JP | 2003-188321 | A | 7/2003 |
| JP | 2004-254387 | A | 9/2004 |
| TW | 346566 | | 12/1998 |
| TW | 586648 | | 5/2004 |
| WO | 98/39955 | A2 | 9/1998 |

OTHER PUBLICATIONS

International Search Report of PCT/JP2005/013527 mailed on Oct. 25, 2005.
English abstract of 10-122774.
English abstract of 2003-188321.
English abstract of 04-101449.
English abstract of 2002-262583.
Concise explanation for 2002-262583.
Chinese Office Action dated Jul. 31, 2009 issued in corresponding Chinese patent Application No. 200580024480.4.
Japanese Office Action dated Apr. 6, 2010 issued in corresponding Japanese patent Application No. 2004-212127.
Supplementary European Search Report dated Apr. 29, 2010, issued in corresponding European Patent Application No. 05766317.1.
Japanese Office Action dated Oct. 26, 2010, issued in corresponding Japanese Patent Application No. 2004-212127.
Taiwanese Office Action dated Jan. 14, 2011, issued in corresponding Taiwanese Patent Application No. 94124256.

* cited by examiner

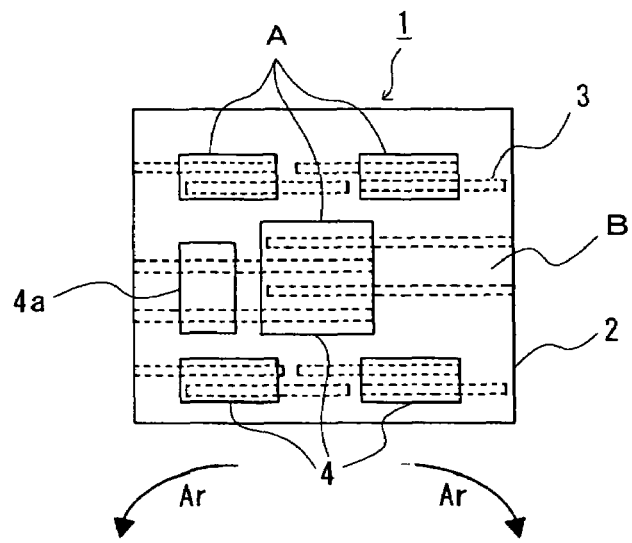 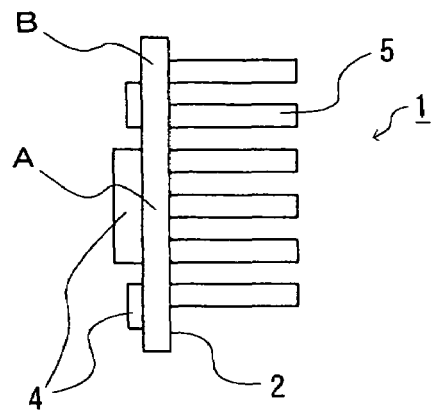
Fig. 1(a) Fig. 1(b)
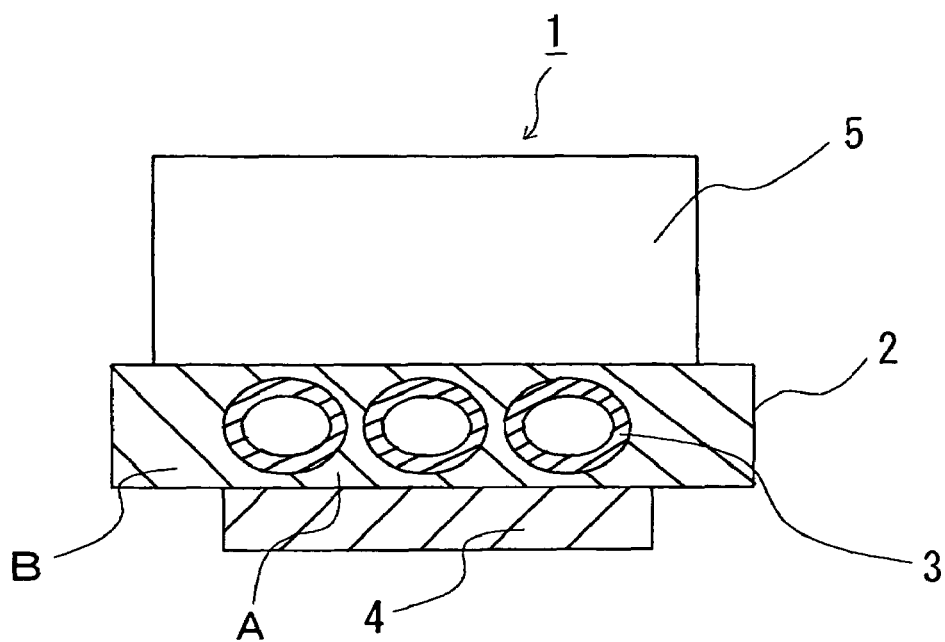
Fig. 2

*Fig. 5*
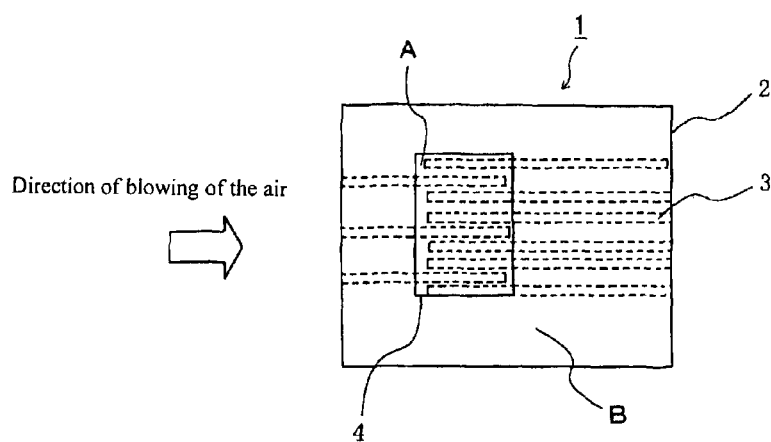
Direction of blowing of the air →
*Fig. 6(a)*     *Fig. 6(b)*
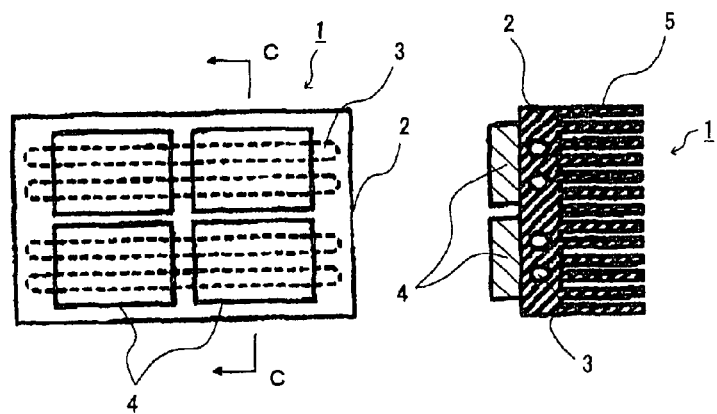

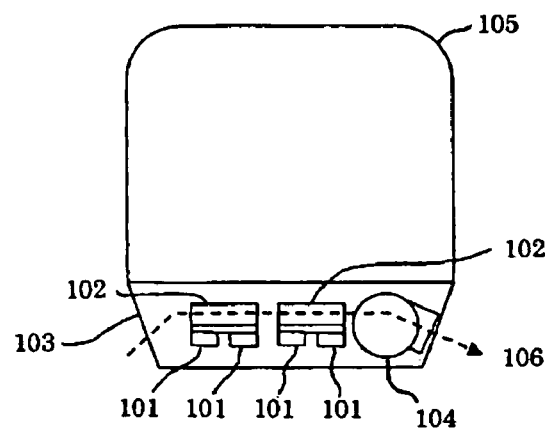
Fig. 7A
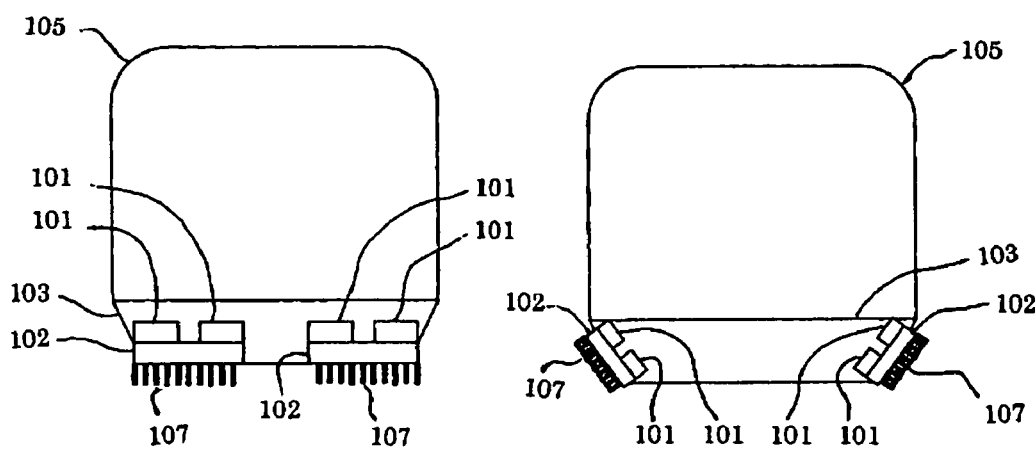
Fig. 7B(1)　　　　Fig. 7B(2)
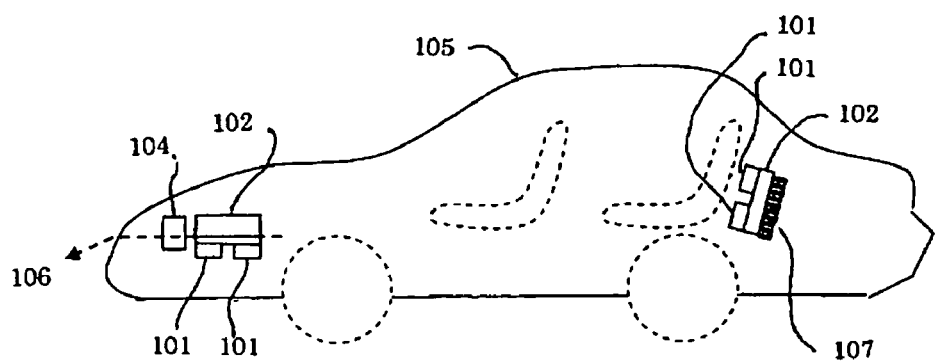
Fig. 7C

HEAT PIPE HEAT SINK

This application is a continuation of international application PCT/JP2005/013527, filed on Jul. 15, 2005.

TECHNICAL FIELD

The present invention relates to a heat sink used for cooling heating elements such as electronic components and optical components, and more particularly, to the heat sink disposed in railroad vehicles or automobiles to be used not only in a horizontal state but also in an inclined state.

BACKGROUND ART

Up to now, as a heat sink for cooling heating elements such as an IGBT (insulated gate bipolar transistor) used in power electronics, a relatively inexpensive heat sink has been used in many cases, which has a structure in which a base plate having heating members retained on one surface thereof is used, and a plurality of radiating fins are disposed in a comb-shape or a grid-shape on the other surface of the base plate. However, radiating capability of the heat sink having such the configuration is not always sufficient. In particular, in order to enhance cooling capability in a case of effectively cooling semiconductor devices having high heat density, commonly used is a heat sink which uses copper heat pipes having high thermal conductivity or a heat sink which uses an evaporative- or boiling-cooling method in which working fluid in heat pipes is a fluorine-containing compound.

Also, a heat sink (1) in which heat pipes are disposed in the base plate in order to enhance the radiating capability has been proposed in, for example, JP-A-2002-262583 ("JP-A" means unexamined published Japanese patent application). In the proposed heat sink (1), since heat pipes 3 are embedded in a base plate 2, as shown in FIGS. 6(a) and 6(b), heat generated by heating members (4) can be equalized over the entire base plate, and thus the cooling capability is intended to be enhanced by causing the radiating function of radiating fins 5 to act effectively over a wide range.

However, the cooling capability of the heat sinks used in railroad vehicles such as bullet trains (Japan Railway Company's Super-Express, Shinkansen) and automobiles needs to be maintained, even if the heat sinks incline in any direction when the railroad vehicles and automobiles go uphill, take curves, or the like. As in the description of JP-A-2002-262583, since heat pipes are commonly embedded in a plurality of heating members, there is a problem in that, although predetermined cooling capability can be obtained when an inclination occurs in a certain direction, the cooling capability decreases when the inclination occurs in a different direction. This is a fatal problem particularly in the case of the heat sink used in an approximately horizontal state, in which the heat pipes cannot be installed in the inclined state because of a limitation concerning a shape and weight. Further, if a high temperature section is located in the vicinity of a central portion of a base, there is a defect in that the heat pipes do not work effectively.

Meanwhile, the heat sink using the evaporation-cooling method, in which the working fluid for cooling the device having high heat density is a fluorine-containing compound (for example, trade name "Fluorinert FX-3250", manufactured by Sumitomo 3M Limited), is expensive because an overall configuration of the heat sink is complex. While a refrigerant having low environment load has been developed, a certain type of a fluorine compound having a significant global warming potential is used in many cases as the refrigerant to obtain a relatively good cooling capability. However, there is an increasing hesitation in the usage thereof these days, from the viewpoint of preventing environment degradation.

In addition, in the heat sink using the heat pipes, it is intended that heat should be radiated by conducting the generated heat from the base plate to the radiating fins disposed to the heat pipes. In a case where the heat sink is configured to have a relatively low height so as to be used in train vehicles such as bullet trains, automobiles, or the like, namely, in the case where a length of radiating sections of the heat pipes disposed with the fins is relatively short, there is a disadvantage in that the heat is not discharged sufficiently because effectiveness concerning thermal conductivity from the heat pipes to the radiating fins is insufficient.

Further, in a case where cooling water is used as a cooling fluid, if an ambient temperature in a place where the heat sink having such the configuration is used reaches below 0 (zero) ° C., there is a fear that the cooling water in the heat pipes may be frozen on a radiating section side and not reflow toward a heat-receiving section, so there is a defect in that an essential function of the heat pipes cannot be obtained. In addition, there is a case where the heat pipes themselves are exposed to the outside on a surface of the base plate, so there is a problem in that the exposed portion is broken because the cooling water therein is frozen during use and transportation.

DISCLOSURE OF INVENTION

According to the present invention, there is provided the following means:

(1) A heat sink, characterized in that heat pipes are disposed in a high temperature section of a base plate on which a heating element is disposed so that the heat pipes extend from the high temperature section to low temperature sections in different directions;

(2) The heat sink according to the item (1), characterized in that the heat pipes are disposed in proximity to each other in the high temperature section so as to be in parallel and/or overlap with each other;

(3) The heat sink according to the item (1) or (2), characterized in that the heat pipes are disposed so as to extend radially from the high temperature section to the low temperature sections;

(4) The heat sink according to any one of the items (1) to (3), characterized in that the number of heat pipes disposed so as to extend from the high temperature section to the low temperature sections on a leeward side exceeds the number of heat pipes disposed so as to extend from the high temperature section to the low temperature sections on a windward side;

(5) The heat sink according to any one of the items (1) to (4), characterized in that the base plate includes an extruded material having a plurality of holes, in which the heat pipes varied in lengths and positions for the respective holes are disposed; and (6) The heat sink according to any one of the items (1) to (5), characterized in that the heat sink is used in railroad vehicles or automobiles.

According to the present invention, by allowing the heat to radiate from the heating member to a wide range of the base plate through the heat pipes to equalize the heat in the base plate, it is possible to provide a heat sink configured to maintain high cooling capability and to prevent the temperature of the heating element from increasing significantly, even if the heat sink is inclined in any direction.

Other and further features and advantages of the invention will appear more fully from the following description, appropriately referring to the accompanying drawings.

BRIEF DESCRIPTION OF DRAWINGS

FIGS. 1(a) and 1(b) each show a schematic configuration of a comb-shaped heat sink according to a mode of the present invention, where FIG. 1(a) is a front view viewed from an opposite side of radiating fins thereof, and FIG. 1(b) is a side view thereof.

FIG. 2 is a cross sectional view showing an example of disposition of the heat pipes in the heat sink of the present invention.

FIG. 5 is a plan view showing a schematic configuration of the comb-shaped heat sink according to yet another mode of the present invention.

FIGS. 6(a) and 6(b) each show a schematic configuration of the comb-shaped heat sink having the heat pipes of the conventional example, where FIG. 6(a) is a plan view thereof, and FIG. 6(b) is a cross sectional view taken along the line C-C.

FIG. 7A is an example of air-cooling with a blower.

FIGS. 7B(1) and 7B(2) are examples of air-cooling with the external air.

FIG. 7C is an example of air-cooling with a blower in an automobile.

BEST MODE FOR CARRYING OUT THE INVENTION

Figure 3:
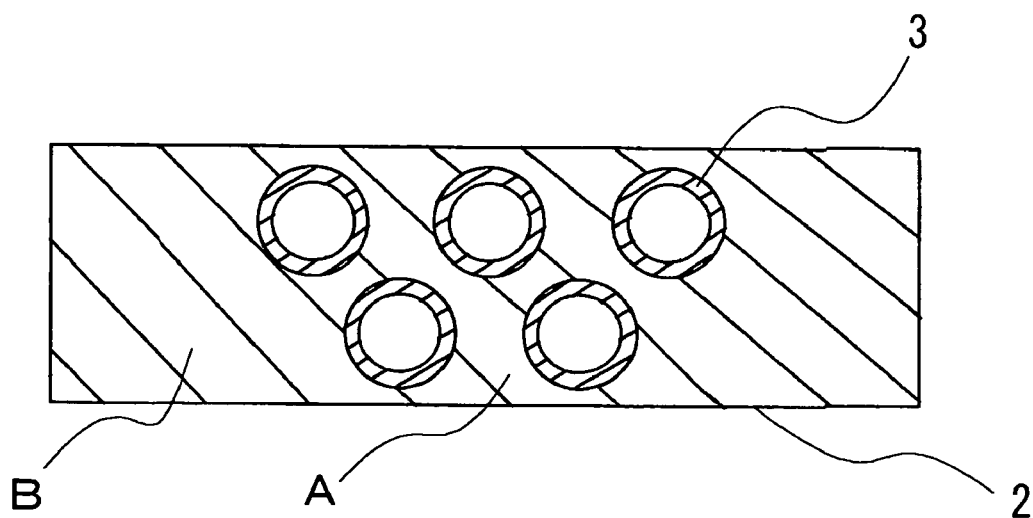
FIG. 3 is a cross sectional view showing another example of disposition of the heat pipes in the heat sink of the present invention, in which only a portion of the base plate of the heat sink is shown.

Preferable and specific embodiments of the heat sink of the present invention will be explained in detail below with reference to FIGS. 1(a) to 5, but the present invention is not limited to embodiments that are shown in the drawings. The same reference symbols are provided to the same components in the drawings, and duplicate explanations will be omitted.

FIGS. 1(a) and 1(b) each show a first mode of a heat sink of the present invention, which is a fundamental schematic configuration of a comb-shaped heat sink, FIG. 1(a) is a front view viewed from an opposite side of radiating fins thereof, and FIG. 1(b) is a side view thereof.

Although FIGS. 1(a) and 1(b) each show an example of a case where a base plate 2 is disposed vertically, the base plate 2 may be disposed horizontally. The base plate 2 and each radiating fin 5 may be formed unitarily by an aluminum extrusion method, and needless to say, any of other alternative methods such as a brazing method, a soldering method, a welding method, or a swaging method can be used for attaching each radiating fin 5 to the base plate 2.

The radiating fin 5 can be of any shape, that is, although an example shown in the figures is a comb-shape, it may be a grid-shape either.

In the comb-shaped heat sink 1, a heating element 4 such as IGBT as a heating member is retained on one surface of the base plate 2 in a fixed manner, and a plurality of radiating fins 5 are disposed in parallel to each other on the other surface of the base plate 2. Further, heat pipes 3 are disposed in and fixed to the base plate 2.

At least two heat pipes 3 are disposed in a high temperature section A of the base plate 2 and extend from the high temperature section A toward low temperature sections B in different directions opposite to each other.

The high temperature section means a portion in which the heating element 4 is attached onto a surface of the base plate, and the low temperature sections mean portions in which the heating element 4 is not attached or portions in which element 4a having lower heating capacity than that of the heating element 4 is attached.

In a case where there are a plurality of high temperature sections A (a plurality of heating elements are attached), the heat pipes are disposed so as to extend from each high temperature section toward low temperature sections in different directions opposite to each other (opposite directions). FIG. 1(a) shows an example in which the heat pipes are disposed in parallel to each other in two directions, that is, a direction toward a low temperature section B on a right-hand side and a direction toward a low temperature section B on a left-hand side from the high temperature section A just below the element. In addition, as from the high temperature section A at the center, a plurality of the heat pipes may be disposed toward each direction. The examples shown here are extremely effective when used in the inclined state.

When the heat sink 1 is disposed vertically as shown in FIGS. 1(a) and 1(b), if the heat sink 1 may be inclined toward a right-hand side or a left-hand side as indicated by arrows Ar shown in FIG. 1(a), it is preferable that the heat pipes 3 be disposed in horizontal directions. Further, when the heat pipes are disposed while being slightly inclined at an angle of approximately 1° to 15° with respect to a horizontal position so that a radiating section is higher than a heat-receiving section, the effect of transferring the heat can be obtained more easily due to vaporization or a relative density difference based on a temperature of a working fluid. Although the heat pipes 3 are disposed horizontally in the example shown in FIG. 1(a), the heat pipes 3 may be disposed at any angle between the angle of the horizontal position and the angle of the vertical position with respect to the horizontal position.

When the base plate 2 of the heat sink 1 is disposed horizontally, it is preferable that the heat pipes 3 be disposed approximately in parallel with the vertical direction with respect to an inclination axis about which the base plate 2 is inclined. For example, when the base plate 2 is inclined toward the right-hand side and the left-hand side, the inclination axis extends in a vertical direction across the base plate, so the heat pipes 3 are disposed in parallel with one another toward the left-hand side and the right-hand side from the high temperature section. When the base plate 2 is inclined in the vertical direction across the base plate, the heat pipes 3 each extending from the high temperature section are disposed in parallel with one another in the vertical direction across the base plate.

In the heat sink in which the heat pipes are disposed so as to extend from the high temperature section toward the low temperature sections in different directions opposite to each other, the heat pipes can be allowed to operate effectively not only at a specific inclination but also at a plurality of predetermined inclinations, and the effectiveness is better as the significance of the inclination is larger. Further, since the inclination angle of the heat pipes becomes significant by inclining the base plate, so an amount of heat transferred via the heat pipes increases, and the heat of the element (or device) is spread over a wide range of the base plate, thereby effectively preventing the element from reaching excessively high temperature.

Also, when the heat pipes are embedded in the base plate over entire lengths of those, and the high temperature section is located halfway (examples shown in FIGS. 6(a) and 6(b)), it is often that the heat cannot be transferred efficiently over the entire lengths because the refrigerant in the heat pipes dries out halfway. On the other hand, in the present invention, the heat pipes each are disposed so as to extend from the high temperature section to the predetermined low temperature sections, and with such the disposition, heat received by the high temperature section is discharged at the low temperature sections, so it is possible to operate the heat pipes efficiently.

It is preferable that the heat pipes be made of metals having good thermal conductivity such as copper, aluminum, or brass. While the heat pipes may have any cross sectional shape such as a circle, an oval, or a rectangle, the circular cross sectional shape is preferable from the point of view of the amount of the heat-transfer.

It is preferable that the heat pipes be fixed onto the base plate by a method causing relatively low thermal contact resistance, such as a brazing method or a soldering method, but other methods such as a swaging method, a method using thermally-conductive grease, or a method using adhesive or the like are also applicable.

With respect to the dispositions of the heat pipes, setting of lengths, positions, number of stages, number of arrays, and the like of the heat pipes 3 is performed, in consideration of not only the inclination directions but also limitations due to positions of the base plate 2 and the element 4 reaching high temperature, and positions of screws for fixing the element and the pipes, or the like.

FIGS. 2 and 3 each are a cross sectional view showing an example of disposition of the heat pipes in the heat sink 1 of the present invention. Note that unlike FIGS. 1(a) and 1(b), FIG. 2 shows an aspect in which the radiating fins 5 are disposed in a direction perpendicular to the heat pipes 3. Also, FIG. 3 shows the disposition of the heat pipes only in a portion of the base plate. The heat pipes 3 may be disposed not only in a single stage or plane in the high temperature section A of the base plate 2 directly below the portion onto which the heating element 4 is attached as shown in FIG. 2, but also in a plurality of stages in parallel with one another as shown in FIG. 3. The base plate 2 may be formed of a plate of aluminum, an aluminum alloy, copper, a copper alloy, or the like, it may be manufactured at a relatively low cost if it is formed of an extruded aluminum material. Also, if a plurality of unit base plates are produced, stacked on, and attached to each other while varying the angles thereof, it is possible to easily manufacture the base plate 2 having a structure with a more suitable shape.

According to the configuration of the comb-shaped heat sink 1, since the heat pipes 3 are disposed and embedded in the base plate 2, even if the cooling water in the heat pipes 3 is frozen at an operation-starting time, the frozen water melts easily and quickly because the temperature of the base plate 2 itself increases along with starting of the operation, so the function of the heat pipes 3 will never be lost. Further, since the heat pipes 3 are embedded in the base plate 2 in this manner and not all of the length thereof is exposed to the outside, even if the cooling water therein is frozen during usage or transportation, it is possible to reliably avoid the risk that the pipes themselves may be broken.

In addition, it is possible to increase the heat-transfer amount and to operate any one of the heat pipes in the inclined states, by causing the heat pipes 3 be disposed in parallel with each other and/or in an overlapping manner in proximity to one another in the high temperature section as shown in FIGS. 2 and 3, so it is possible to prevent the temperature of the element or device from increasing locally.

Further, by using, as the base plate 2, an extruded material in which a plurality of holes are preformed, it is possible to form the plurality of holes in the base plate at low cost, so each heat pipe can be disposed so as to work in each hole at the inclination in a predetermined direction (hole extending direction).

Figure 4:
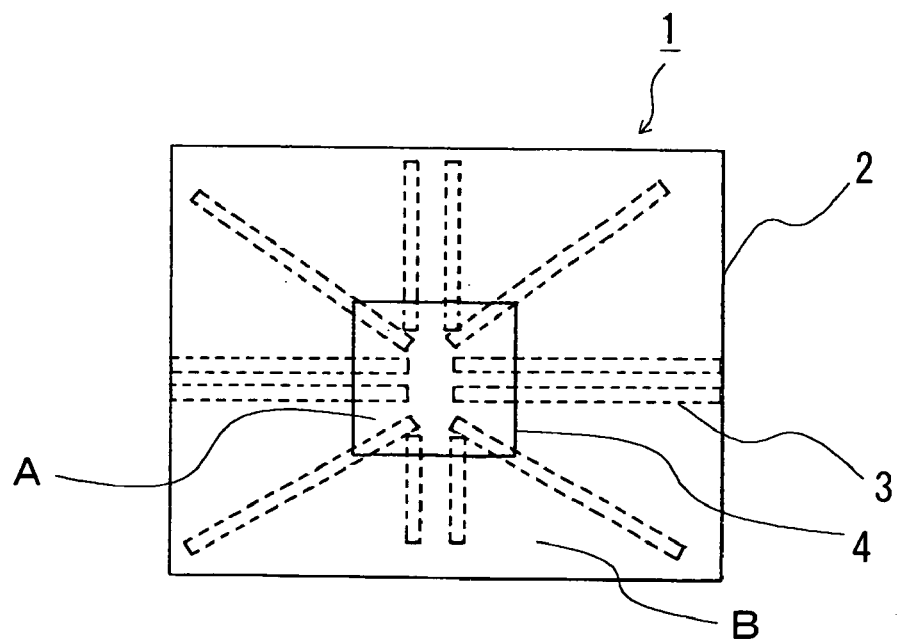
FIG. 4 is a plan view showing a schematic configuration of the comb-shaped heat sink according to another mode of the present invention.

FIG. 4 is a plan view showing a fundamental schematic configuration of the comb-shaped heat sink 1 according to another mode of the present invention. The base plate 2 is disposed in a horizontal state in the present mode, but the base plate 2 may be disposed at any angle.

A plurality of heat pipes 3 are disposed so as to extend radially, from the high temperature section A, onto which the heating element 4 is attached, toward the low temperature sections B. With this disposition of the heat pipes 3, irrespective of an angle or a direction with which the heat sink 1 is disposed or inclined, the heat generated by the element at the center is introduced to the low temperature sections by the functions of any one of the heat pipes, thus, the increase of temperature is prevented. It is possible to deal with the inclinations in various directions, by disposing the plurality of heat pipes radially in this manner.

Although FIG. 4 shows a configuration in which the heat pipes 3 are disposed in a single stage or on a single plane, the function of the heat pipes can be brought out effectively, by disposing the heat pipes in a layered structure as shown in FIG. 3 so that most portions of the heat pipes which overlap the high temperature section.

Next, FIG. 5 is a plan view showing the schematic configuration of the comb-shaped heat sink 1 in accordance with yet another mode of the present invention, in which the cooling operation is enhanced by blowing the air. This is a case where the base plate 2 is disposed horizontally, but the base plate 2 may be disposed at any angle.

The number of heat pipes disposed and directed from the high temperature section A, onto which the heating element 4 is attached, toward the low temperature sections B on a leeward side exceeds (excluding the case where it is equal to) the number of heat pipes disposed and directed from the high temperature section A toward the low temperature sections B on a windward side.

If the number of heat pipes are the same between the windward sides and the leeward side, the temperature tends to increase on the leeward side, so the temperature of the base increases and difference of the temperatures between the base and the heat-receiving section of the heat pipes is less significant, and the amount of heat transferred to the leeward side tends to decrease. However, it is possible to transfer a greater amount of heat toward the leeward side by disposing more heat pipes extending toward the leeward side, so it is possible to suppress the increase of temperature in the element even if the leeward side is inclined upwardly.

Therefore, the configuration is preferable to be applied to the heat sink for train vehicles such as the bullet trains in which unidirectional forced air cooling is conducted by using fans.

Also, since the heat pipes are embedded in the base plate of the heat sink according to the present invention, even if the cooling water in the heat pipes is frozen at the operation-starting time, the frozen water melts easily because the temperature of the base plate itself increases along with starting of the operation, so the function of the heat pipes will never be lost. Further, since the heat pipes are embedded in the base plate in this manner and entire lengths of those are not exposed to the outside, even if the cooling water inside thereof is frozen during usage or transportation, it is possible to avoid the risk that the pipes themselves may be broken.

Note that, the refrigerant used in the present invention may be not only water but also any of various refrigerants used in heat sinks.

As stated in the above, the heat sink of the present invention has excellent heat-radiating effect, even if the heat sink is disposed or used in the inclined state, so it is particularly suitable to be used in railroad vehicles or automobiles which often incline in arbitrary directions particularly at the time of use.

In the heat sink according to the present invention, since the heat pipes are disposed so as to extend from the high temperature section to the low temperature sections in different directions, even if various inclinations that could not have conventionally been dealt with occur, any one of the heat pipes exert its function, thereby exhibiting excellent cooling capability. In addition, since the heat pipes are disposed in parallel with each other and/or in an overlapping manner so as to be in proximity with one another in the high temperature section, it is possible to prevent the temperature of the element from increasing locally.

Also, since the heat pipes are disposed so as to extend radially from the high temperature section to the low temperature sections, any one of the heat pipes exerts its function so as to deal with inclinations in various directions, thereby exhibiting excellent cooling capability.

Further, since the number of heat pipes disposed so as to extend from the high temperature section to the low temperature sections on a leeward side exceeds the number of heat pipes disposed so as to extend from the high temperature section to the low temperature sections on the windward side, a significant amount of heat is transferred toward the leeward side through the heat pipes, thereby making it possible to prevent the increase of temperature in the element.

Also, since the heat pipes are disposed in the extruded material of the base plate, the extruded material having a plurality of holes preformed therein, with the length and positions of the heat pipes varying for each hole, the manufacture can be performed at low cost.

FIG. 7A is an example of air-cooling with a blower, FIGS. 7B(1) and 7B(2) are examples of air-cooling with the external air, and FIG. 7C is an example of air-cooling with a blower in an automobile. In FIGS. 7A-7C, the following identifiers are applicable: 101 is a Heating element (e.g. semiconductor device); 102 is a Heat sink; 103 is an Electric power conversion system; 104 is an Electric blower; 105 is a Railroad vehicle or automobile body; 106 is a Cooling air; and 107 is a Radiating fin.

INDUSTRIAL APPLICABILITY

Since the above-explained excellent heat-radiating effect can be obtained, the present invention is preferable for cases in which the heat sink is disposed and used in the inclined state such as the railroad vehicles and the automobiles.

Having described our invention as related to the present embodiments, it is our intention that the invention not be limited by any of the details of the description, unless otherwise specified, but rather be construed broadly within its spirit and scope as set out in the accompanying claims.

The invention claimed is:

1. A heat sink, characterized in that heat pipes are disposed in a high temperature section of a base plate on which a heating element is disposed so that the heat pipes extend from the high temperature section to low temperature sections in different directions relative to the high temperature section;
    wherein the heat pipes extend radially from the high temperature section to the low temperature sections.

2. A heat sink, characterized in that heat pipes are disposed in a high temperature section of a base plate on which a heating element is disposed so that the heat pipes extend from the high temperature section to low temperature sections in different directions;
    wherein the heat pipes are disposed in proximity to each other in the high temperature section so as to be in parallel and/or overlap with each other.

3. A heat sink, characterized in that heat pipes are disposed in a high temperature section of a base plate on which a heating element is disposed so that the heat pipes extend from the high temperature section to low temperature sections in different directions;
    wherein the number of heat pipes disposed so as to extend from the high temperature section to the low temperature sections on a leeward side exceeds the number of heat pipes disposed so as to extend from the high temperature section to the low temperature sections on a windward side.

4. A heat sink, characterized in that heat pipes are disposed in a high temperature section of a base plate on which a heating element is disposed so that the heat pipes extend from the high temperature section to low temperature sections in different directions;
    wherein the base plate includes an extruded material having a plurality of holes, in which the heat pipes varied in lengths and positions for the respective holes are disposed.

5. A heat sink, characterized in that heat pipes are disposed in a high temperature section of a base plate on which a heating element is disposed so that the heat pipes extend from the high temperature section to low temperature sections in different directions;
    wherein the heat sink is used in railroad vehicles or automobiles.

6. The heat sink according to claim 1, wherein said heat pipes are a plurality of independent heat pipes.

7. The heat sink according to claim 1, wherein the heat pipes terminate in the high temperature section at one end and terminate in the low temperature section at another end.

* * * * *